United States Patent
Zhu

(10) Patent No.: US 12,165,967 B2
(45) Date of Patent: Dec. 10, 2024

(54) INTERCONNECTION STRUCTURE AND MANUFACTURING METHOD THEREOF AND SEMICONDUCTOR STRUCTURE

(71) Applicant: CHANGXIN MEMORY TECHNOLOGIES, INC., Hefei (CN)

(72) Inventor: Delong Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 500 days.

(21) Appl. No.: 17/501,326

(22) Filed: Oct. 14, 2021

(65) Prior Publication Data

US 2022/0246519 A1 Aug. 4, 2022

Related U.S. Application Data

(63) Continuation of application No. PCT/CN2021/106429, filed on Jul. 15, 2021.

(30) Foreign Application Priority Data

Feb. 3, 2021 (CN) .......................... 202110149536.X

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76814* (2013.01); *H01L 21/76831* (2013.01); *H01L 21/76877* (2013.01); *H01L 23/53266* (2013.01)

(58) Field of Classification Search
CPC .......... H01L 23/5226; H01L 23/53266; H01L 21/76834; H01L 21/76831; H01L 21/76877; H01L 21/76814
See application file for complete search history.

(56) References Cited

U.S. PATENT DOCUMENTS 9,305,836 B1 * 4/2016 Gates ................ H01L 21/76864
9,831,174 B1 * 11/2017 Zhang ............... H01L 21/28556
(Continued)

FOREIGN PATENT DOCUMENTS

CN 103325728 A 9/2013
CN 103531524 B 2/2017
(Continued)

OTHER PUBLICATIONS

International Search report cited in PCT/CN2021/106429, mailed Nov. 10, 2021, 10 pages.

*Primary Examiner* — Jaehwan Oh
*Assistant Examiner* — John M Parker
(74) *Attorney, Agent, or Firm* — Syncoda LLC; Feng Ma

(57) ABSTRACT

The present disclosure provides an interconnection structure and a manufacturing method thereof and a semiconductor structure, and relates to the technical field of semiconductors. The interconnection structure includes a substrate, a dielectric layer arranged on the substrate and an insulation layer, wherein a plurality of wires are arranged in the dielectric layer at intervals; a recess is arranged in a portion, between adjacent wires, of the dielectric layer, and a bottom of the recess exposes a surface of the substrate; and the insulation layer includes an extension portion extending into the recess, and a gap is arranged between the extension portion and the substrate.

9 Claims, 4 Drawing Sheets

(56) References Cited

U.S. PATENT DOCUMENTS

| | | | |
|---|---|---|---|
| 11,183,421 B2 | 11/2021 | Hsieh et al. | |
| 11,355,430 B2* | 6/2022 | Lo | H01L 21/76831 |
| 2001/0051423 A1 | 12/2001 | Kim et al. | |
| 2009/0309230 A1* | 12/2009 | Cui | H01L 23/53238 |
| | | | 257/773 |
| 2013/0115769 A1* | 5/2013 | Yu | H01L 21/76898 |
| | | | 257/E21.597 |
| 2020/0411415 A1* | 12/2020 | Wu | H01L 21/76832 |
| 2023/0238449 A1* | 7/2023 | Su | H01L 21/76897 |
| | | | 257/401 |

FOREIGN PATENT DOCUMENTS

| | | |
|---|---|---|
| CN | 107680953 A | 2/2018 |
| CN | 107895711 A | 4/2018 |
| CN | 108074866 A | 5/2018 |
| CN | 110880476 A | 3/2020 |
| CN | 112928095 A | 6/2021 |

\* cited by examiner

US 12,165,967 B2

INTERCONNECTION STRUCTURE AND MANUFACTURING METHOD THEREOF AND SEMICONDUCTOR STRUCTURE

CROSS-REFERENCE TO RELATED APPLICATIONS

This is a continuation of International Application No. PCT/CN2021/106429, filed on Jul. 15, 2021, which claims the priority to Chinese Patent Application 202110149536.X, titled "INTERCONNECTION STRUCTURE AND MANUFACTURING METHOD THEREOF AND SEMICONDUCTOR STRUCTURE", filed on Feb. 3, 2021. The entire contents of International Application No. PCT/CN2021/106429 and Chinese Patent Application 202110149536.X are incorporated herein by reference.

TECHNICAL FIELD

The present disclosure relates to the technical field of semiconductors, in particular to an interconnection structure and a manufacturing method thereof and a semiconductor structure.

BACKGROUND

When manufactured, semiconductor structures require an essential interconnection structure, for example a dynamic random access memory (DRAM for short). The dynamic random access memory formed consists of a core memory region and a peripheral circuit region in general, the core memory area is provided with a plurality of memory cells for storing data information, and the core memory area and the peripheral circuit region usually include interconnection structures. Being electrically connected to the interconnection structures, the memory cells can store or read the data information.

In the related art, the interconnection structure covers at least one interconnection layer as a rule, which includes a plurality of metal wires arranged at intervals and a dielectric layer for isolating the metal wires from one another. As the semiconductor structures develop into miniaturized and integrated ones, a distance between adjacent metal wires in the same interconnection layer decreases accordingly. Parasitic capacitance that is formed between adjacent metal wires can cause signal delay, and weaken the performance of the semiconductor structures consequently.

SUMMARY

According to a first aspect of the embodiments of the present disclosure, an interconnection structure is provided. The interconnection structure includes:
  a substrate;
  a dielectric layer, wherein the dielectric layer is arranged on the substrate, a plurality of wires are arranged in the dielectric layer at intervals, a recess is arranged in a portion, between adjacent wires, of the dielectric layer, and a bottom of the recess exposes a surface of the substrate; and
  an insulation layer, wherein the insulation layer is arranged on the dielectric layer, the insulation layer includes an extension portion extending into the recess, and a gap is arranged between the extension portion and the substrate.

According to a second aspect of the embodiments of the present disclosure, a method of manufacturing an interconnection structure is provided. The manufacturing method includes:
  providing a substrate;
  forming a dielectric layer on the substrate, wherein a plurality of wires are arranged in the dielectric layer at intervals;
  patterning the dielectric layer, wherein a plurality of recesses are formed in the dielectric layer, the recess is located between adjacent wires, and a bottom of the recess exposes a surface of the substrate; and
  forming an insulation layer on the dielectric layer, wherein the insulation layer includes an extension portion extending into the recess, and a gap is arranged between the extension portion and the substrate.

According to a third aspect of the embodiments of the present disclosure, a semiconductor structure is provided, which includes an interconnection structure above.

DETAILED DESCRIPTION

Figure 1:
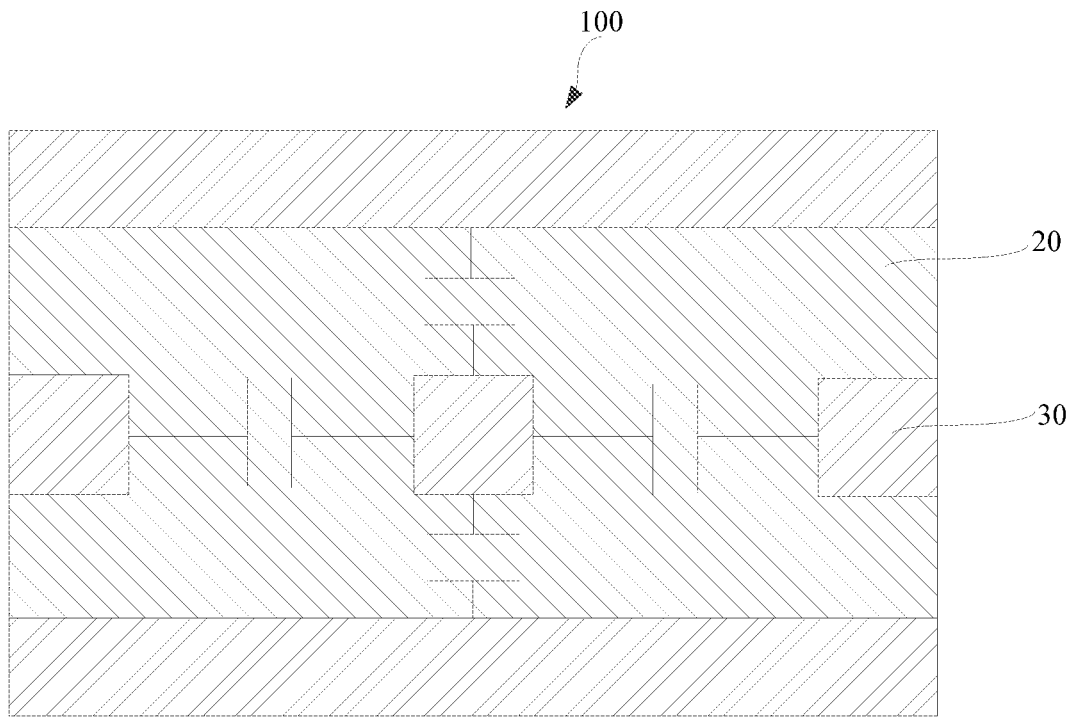
FIG. 1 is a schematic diagram of an interconnection structure provided in related art.

In practical work, the inventor found that, as shown in FIG. 1, the smaller the size (such as a thickness or a length) of a semiconductor structure, the smaller a vertical distance and a horizontal distance between adjacent wires 30 in the interconnection structure 100 will be, and parasitic capacitance may be formed between adjacent wires, which may cause signal delay in the interconnection structure and reduce performance of the semiconductor structure.

Aimed at the technical problems above, embodiments of the present disclosure provide the interconnection structure and a manufacturing method thereof and a semiconductor structure, a gap is provided between the portion, between adjacent wires, of an insulation layer and a substrate, that is, an air gap is provided between adjacent wires, such that parasitic capacitance between adjacent wires may be reduced since a dielectric constant of air is smaller than that of the insulation layer, thereby reducing signal delay of the interconnection structure and further improving performance of the semiconductor structure.

To make the objectives, features, and advantages above of the embodiments of the present disclosure clearer and easier to understand, the following clearly and completely describes the technical solutions in the embodiments of the present disclosure with reference to accompanying drawings in the embodiments of the present disclosure. Apparently, the described embodiments are merely some rather than all of the embodiments of the present disclosure. All other embodiments obtained by a person of ordinary skill in the art based on the embodiments of the present disclosure without creative efforts shall fall within the protection scope of the present disclosure.

This embodiment provides a semiconductor structure. For example, the semiconductor structure may be a dynamic random access memory (DRAM). The following will take the semiconductor structure in the form of the dynamic random access memory (DRAM) as an example, but this embodiment is not limited to the same. The semiconductor structure in this embodiment may also be in another structure.

Exemplarily, the semiconductor structure may include the substrate, the substrate may include an array region and a peripheral circuit region connected to the array region, capacitors arranged in an array are arranged in the array region, and an interconnection structure is arranged on the peripheral circuit region, which is electrically connected to the capacitors through the interconnection structure, so as to realize storage or reading of data information by the dynamic random access memory.

Figure 2:
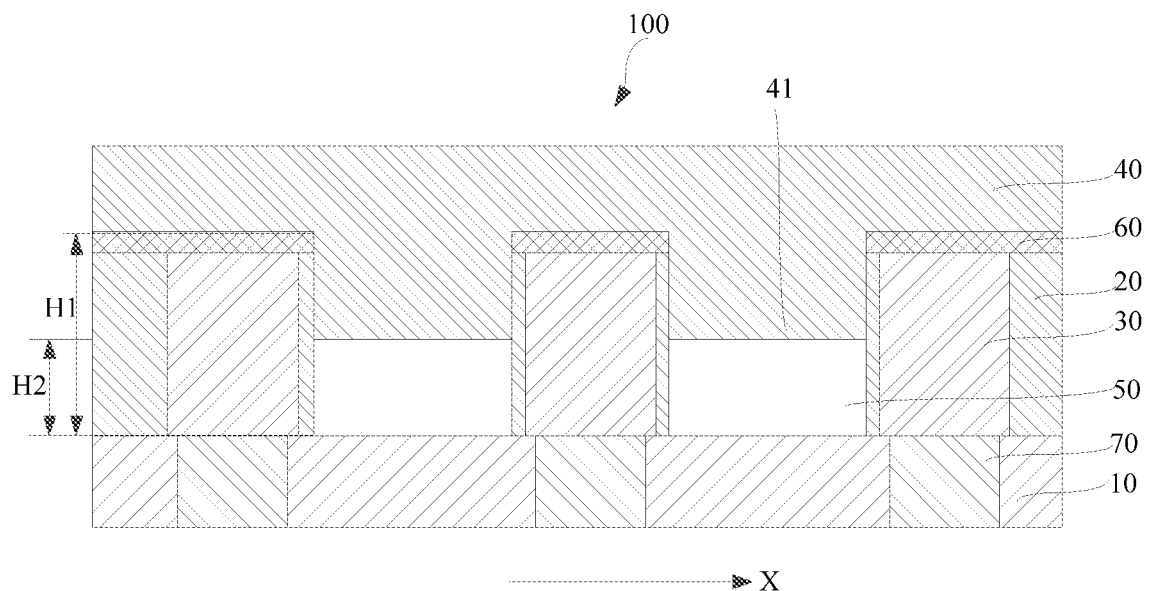
FIG. 2 is a schematic diagram of an interconnection structure provided in an embodiment of the present disclosure.

As shown in FIG. 2, the interconnection structure 100 may include a substrate 10, a dielectric layer 20 with wires 30, and an insulation layer 40, where the substrate 10 is used, as a support component of the interconnection structure 100, for supporting other components arranged thereon, and the substrate 10 may be an oxide layer, for example, the substrate 10 may be a silicon oxide layer.

A plurality of conductive plungers 70 may also be arranged in the substrate 10, the conductive plungers 70 correspond to the wires 30 one to one, and one end of the conductive plunger 70 is connected to the wire 30, and the other end of the conductive plunger 70 is connected to an active region in the substrate 10, so as to connect the wire 30 to the active region in the substrate 10, and realize the performance of the semiconductor structure, that is, to realize the storage or reading of the data information by the dynamic random access memory. The conductive plungers 70 may be made from conductive materials including tungsten, etc.

The dielectric layer 20 is arranged on the substrate 10, and the plurality of wires 30 are arranged in the dielectric layer 20 at intervals. It should be noted that the plurality of wires 30 may be arranged at intervals in a horizontal direction of the substrate 10, and intervals between adjacent wires 30 may be the same or different, which is not specifically defined in this embodiment.

It should be noted that in this embodiment, the horizontal direction of the substrate 10 may be an X direction in FIG. 2.

In this embodiment, the dielectric layer 20 may be made from materials including silicon oxide, etc., and an insulation performance between adjacent wires 30 is realized by utilizing an insulation performance of the silicon oxide.

A recess is provided in a portion, between adjacent wires 30, of the dielectric layer 20, the recess may extend in a direction perpendicular to the substrate 10 until a bottom of the recess exposes a surface of the substrate 10, that is, the recess is a trench penetrating the dielectric layer 20 in the direction perpendicular to the substrate 10, and the bottom of the recess is a part of a top surface of the substrate 10.

Exemplarily, in this embodiment, a width of the recess may be smaller than an interval between adjacent wires 30, such that the dielectric layer 20 covers a side, facing the recess, of the wire 30, thus guaranteeing the insulation performance between adjacent wires 30.

Further, the insulation layer 40 is arranged on the dielectric layer 20, wherein the insulation layer 40 may be made from materials including silicon oxide, etc., and while the insulation performance between adjacent wires 30 may be realized by using the insulation performance of the silicon oxide, an insulation performance between other wires above the wires 30 may also be realized.

The insulation layer 40 includes an extension portion 41 extending into the recess, and a gap 50 is arranged between the extension portion 41 and the substrate 10, such that a certain distance is provided between a surface, facing the substrate 10, of the extension portion 41 and the substrate 10, that is, an air gap is arranged between adjacent wires 30. In this embodiment, parasitic capacitance between adjacent wires 30 may be reduced since a dielectric constant of air is smaller than that of the insulation layer 40, thereby reducing the signal delay of the interconnection structure and further improving the performance of the semiconductor structure.

In some embodiments, the distance between the surface, facing the substrate 10, of the extension portion 41 and the top surface of the substrate 10 accounts for $2/3$-$3/4$ of a depth of the recess, that is, H2 is equal to $2/3$ H1-$3/4$ H1. In this embodiment, a height of the gap 50 is defined, which means that the height of the gap 50 should be prevented from being too large or too small.

If the height of the gap 50 is too large, the height of the extension portion 41 may be caused too small, which makes it difficult to guarantee an insulation performance of the insulation layer 40. In addition, if the gap is too small, a dielectric constant between adjacent wires 30 may still be caused too large, which makes it difficult to reduce the parasitic capacitance between adjacent wires 30. Therefore, the height of the gap 50 is limited in this embodiment, which not only guarantees the insulation performance of the insulation layer 40, but reduces the parasitic capacitance between adjacent wires 30, thereby reducing the signal delay of the interconnection structure and further improving the performance of the semiconductor structure.

In some embodiments, the interconnection structure 100 further includes a barrier layer 60, the barrier layer 60 is arranged between a top surface of the dielectric layer 20 and the insulation layer 40, and between top surfaces of the wires 30 and the insulation layer 40. The barrier layer 60 is configured to prevent conductive material in the wires from diffusing into the insulation layer, thus guaranteeing the conductivity of the wires.

Specifically, the barrier layer 60 may be made from materials including silicon nitride, etc., and the silicon nitride layer may be arranged, such that the wires may be insulated from a conductive component arranged thereon, but conductive material in the wire may also be prevented from diffusing into the insulation layer.

Figure 3:
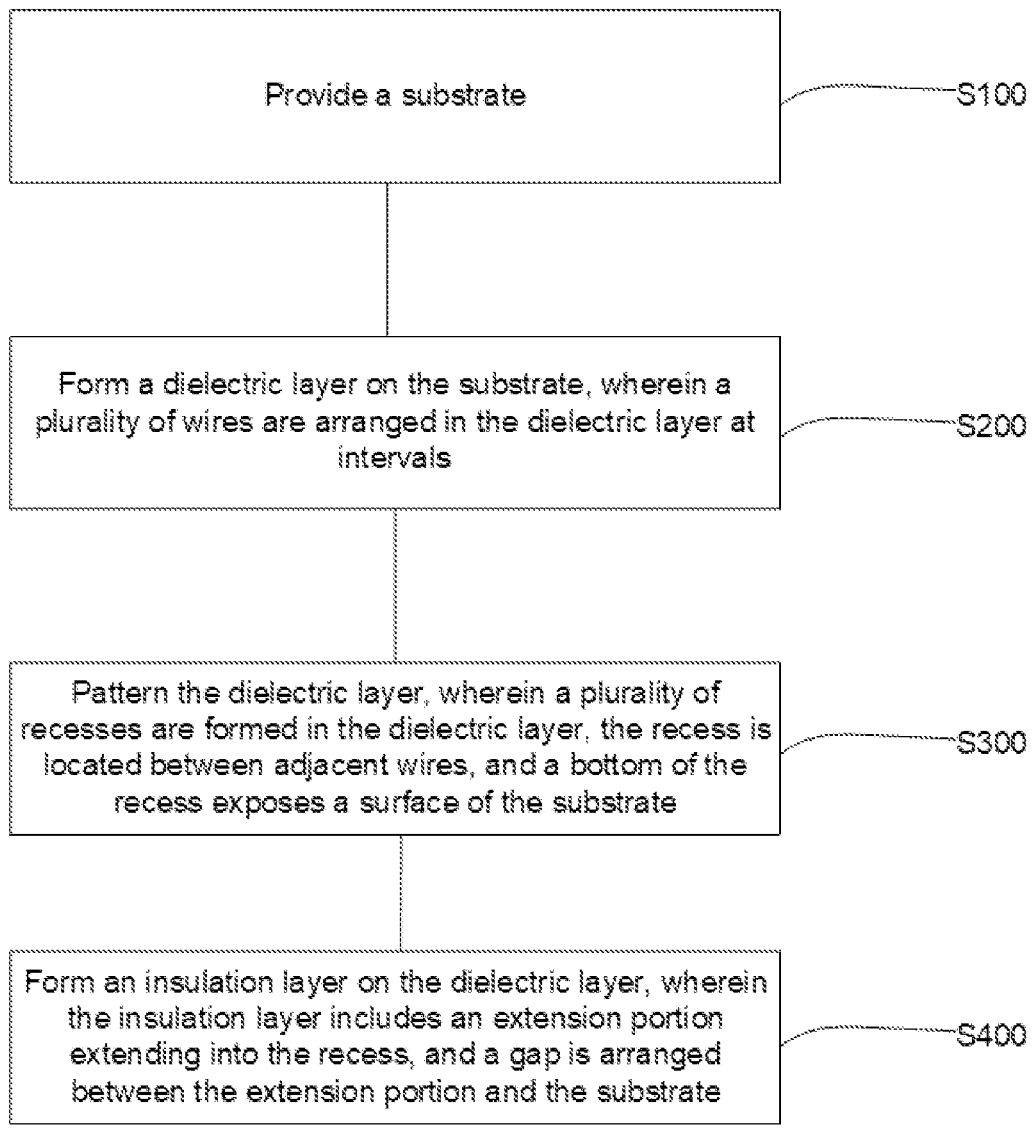
FIG. 3 is a flowchart of a method of manufacturing an interconnection structure provided in an embodiment of the present disclosure.

FIG. 3 is a flowchart of a method of manufacturing an interconnection structure provided in an embodiment of the present disclosure, and FIGS. 4-10 are schematic diagrams for each stage of the method of manufacturing an interconnection structure. The following will describe the method of manufacturing an interconnection structure with reference to FIGS. 3-10.

As shown in FIG. 3, the embodiment of the present disclosure provides the method of manufacturing an interconnection structure. The manufacturing method includes:

S100: a substrate is provided.

Figure 4:
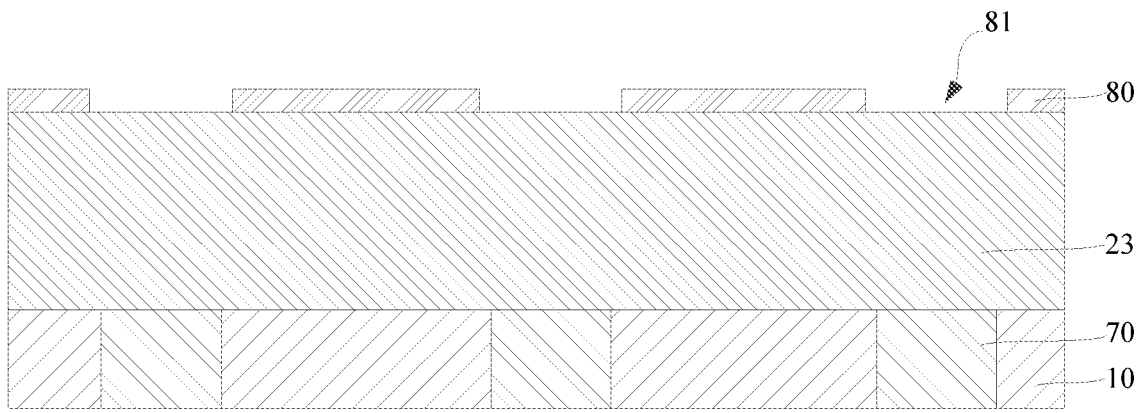
FIG. 4 is a schematic diagram for forming a dielectric layer in the method of manufacturing an interconnection structure provided in an embodiment of the present disclosure.

Exemplarily, as shown in FIG. 4, the substrate 10 is configured, as a support component of the interconnection structure 100, to support other components arranged thereon, and the substrate 10 may be an oxide layer, for example, the substrate 10 may be a silicon oxide layer.

Conductive plungers 70 may also be arranged in the substrate 10, and the conductive plunger 70 may be utilized to electrically connect a wire in the interconnection structure 100 to an active region in the substrate.

Specifically, a patterned photoresist layer may be formed on the substrate 10, and a plurality of containing tanks are arranged on the substrate 10 at intervals by using the photoresist layer as a mask, and then a conductive substance with a certain thickness, for example metal tungsten, is deposited in the containing tanks by utilizing an atomic layer deposition process or a chemical vapor deposition process, and the conductive substance constitutes the conductive plungers 70.

S200: a dielectric layer is formed on the substrate, wherein a plurality of wires are arranged in the dielectric layer at intervals.

Exemplarily, an initial dielectric layer 23 is formed on the substrate 10.

Specifically, the atomic layer deposition (ALD) process, the chemical vapor deposition (CVD) process or a plasma enhanced chemical vapor deposition (PECAD) process may be used to form the initial dielectric layer 23 with a certain thickness on a top surface of the substrate 10. The initial dielectric layer 23 may be made from materials including silicon oxide, silicon nitride, etc.

The initial dielectric layer 23 is patterned and a portion of the initial dielectric layer 23 is etched to form a plurality of openings 21 arranged at intervals in the initial dielectric layer 23, wherein the remainder of the initial dielectric layer 23 constitutes the dielectric layer 20. Specifically, as shown in FIG. 4, the photoresist layer 80 is formed on a surface, away from the substrate 10, of the initial dielectric layer 23, and the photoresist layer 80 is patterned by exposure, development or etching to form a mask pattern on the photoresist layer 80, the mask pattern including a plurality of shielding regions and a plurality of opening regions 81 alternately arranged.

Figure 5:
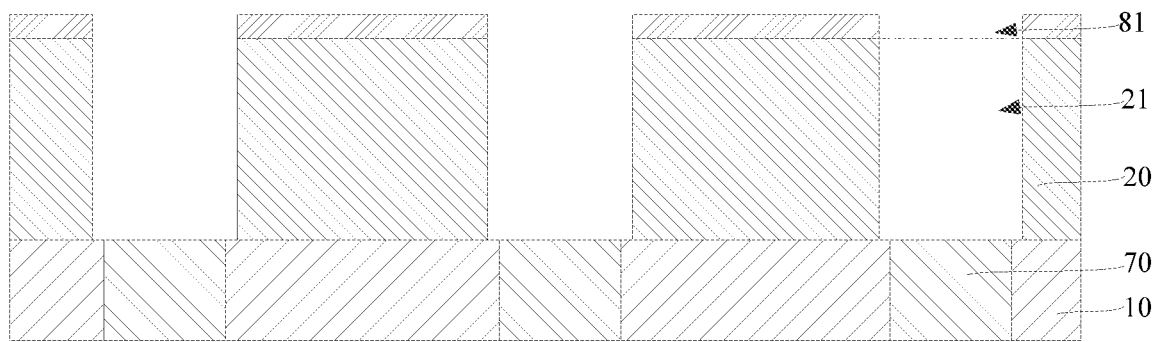
FIG. 5 is a schematic diagram for forming a recess in the method of manufacturing an interconnection structure provided in an embodiment of the present disclosure.

As shown in FIG. 5, the initial dielectric layer 23 is patterned along the opening regions 81, that is, a portion, exposed in the opening regions 81, of the initial dielectric layer 23 is removed through dry etching or wet etching, so as to form a plurality of openings 21 arranged at intervals in the initial dielectric layer 23, wherein the remainder of the initial dielectric layer 23 constitutes the dielectric layer 20.

It should be noted that the portion above a dotted line in FIG. 5 is the opening regions 81, and the portion below the dotted line is the openings 21.

Figure 6:
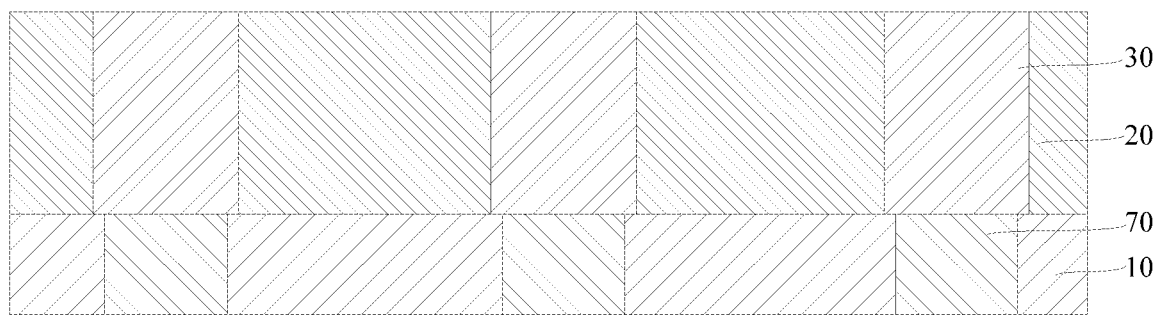
FIG. 6 is a schematic diagram for forming a wire in the method of manufacturing an interconnection structure provided in an embodiment of the present disclosure.

As shown in FIG. 6, the photoresist layer 80 on the dielectric layer 20 is removed by using a cleaning solution or cleaning gas, then wires 30 are formed in the openings 21 by utilizing the atomic layer deposition process or the chemical vapor deposition process, and a top surface, away from the substrate 10, of the wire 30 is flush with a top surface of the dielectric layer 20, wherein the wires 30 may be made from conductive materials including metal tungsten, etc.

Figure 7:
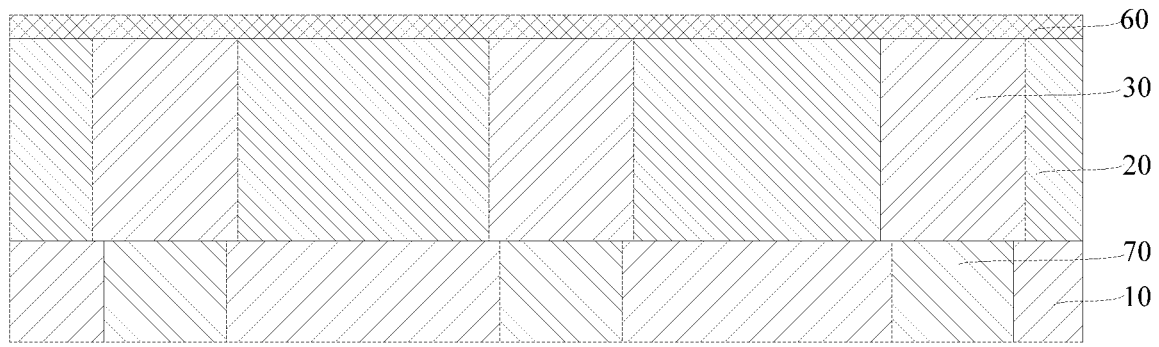
FIG. 7 is a schematic diagram for forming a barrier layer in the method of manufacturing an interconnection structure provided in an embodiment of the present disclosure.

Further, as shown in FIG. 7, in this embodiment, a barrier layer 60 is formed on the dielectric layer 20 and the wires 30, so as to prevent the conductive material in the wires from diffusing to an insulation layer.

Specifically, the barrier layer 60 with a certain thickness may be formed on the top surface of the dielectric layer 20 and the top surfaces of the wires 30 by utilizing the atomic layer deposition process or the chemical vapor deposition process, where the barrier layer 60 may be made from materials including silicon nitride, etc.

S300: the dielectric layer is patterned, where a plurality of recesses are formed in the dielectric layer, the recess is located between adjacent wires, and a bottom of the recess exposes the surface of the substrate.

Figure 8:
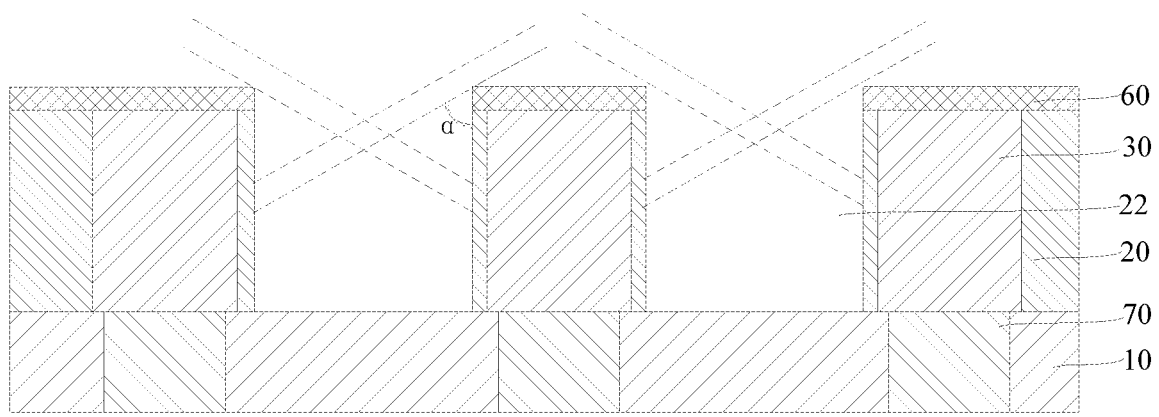
FIG. 8 is a procedure chart for forming a sub-catalyst layer in the method of manufacturing an interconnection structure provided in an embodiment of the present disclosure.

As shown in FIG. 8, a portion, between adjacent wires 30, of the dielectric layer 20 is patterned, so as to form the recess 22 in the dielectric layer 20, and the bottom of the recess 22 exposes the surface of the substrate 10, that is, the recess 22 may extend in a direction perpendicular to the substrate 10 until the bottom of the recess 22 exposes the surface of the substrate, that is, the recess 22 is a trench penetrating the dielectric layer 20 and the bottom of the recess 22 is a part of the top surface of the substrate 10.

Exemplarily, in this embodiment, a width of the recess 22 may be smaller than an interval between adjacent wires 30, such that the dielectric layer 20 covers a side, facing the recess 22, of the wire 30, thus guaranteeing insulation performance between adjacent wires 30.

S400: the insulation layer is formed on the dielectric layer, wherein the insulation layer includes an extension portion extending into the recess, and a gap is arranged between the extension portion and the substrate.

Exemplarily, the forming the insulation layer on the dielectric layer includes:
step a, a sub-catalyst layer is formed on sides of the recess and the top surfaces of the dielectric layer, wherein a gap is arranged between a portion of the sub-catalyst layer on the sides of the recess and the substrate.

Figure 9:
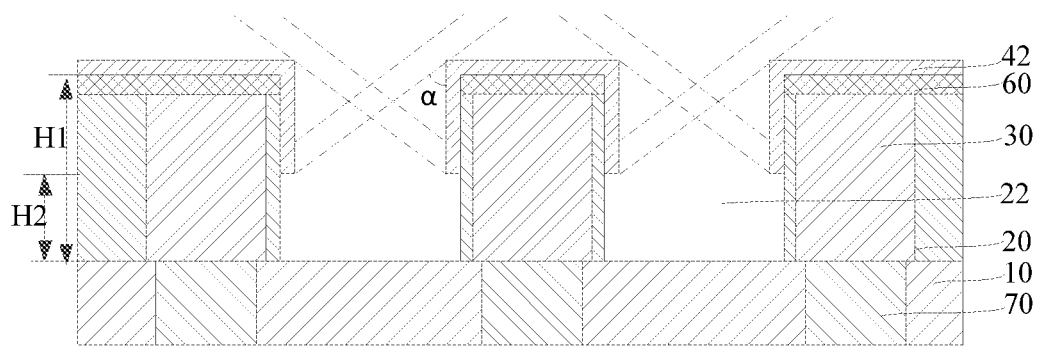
FIG. 9 is a schematic diagram for forming the sub-catalyst layer in the method of manufacturing an interconnection structure provided in an embodiment of the present disclosure.

Specifically, as shown in FIG. 9, impurity elements are implanted into the sides of the recess 22 and the top surface of the dielectric layer 20 through a directional deposition technology, for example, the impurity elements may be implanted into the sides of the recess 22 and the top surface of the dielectric layer 20 by utilizing a physical vapor deposition process or a plasma implantation process, wherein the impurity elements form the sub-catalyst layer 42 on a surface of the dielectric layer 20, and the sub-catalyst layer 42 has relatively strong bonding capacity and may enhance binding force between the dielectric layer 20 and a sub-filling layer formed subsequently.

In this embodiment, the impurity elements may include at least one of boron group element, boron trifluoride, aluminium trichloride or sulfur trioxide, and the boron group element may include boron, aluminum or chromium.

The above elements are deposited on a portion of the sides of the recess 22 and the top surface of the dielectric layer 20 through the directional deposition technology, the above impurity elements may react with the surface of the dielectric layer 20 to form electron-withdrawing compounds, and the electron-withdrawing compounds constitute the sub-catalyst layer 42.

In this embodiment, a gap 50 is arranged between the sub-catalyst layer 42 on the sides of the recess 22 and the substrate 10, that is, a bottom of the sub-catalyst layer 42 on the sides of the recess 22 does not coincide with the top surface of the substrate 10.

An interval between an surface, facing the substrate 10, of the sub-catalyst layer 42 and the substrate 10 is denoted as H2, a depth of the recess 22 is denoted as H1, and H2 is equal to ⅔ H1-¾ H1. In this embodiment, an interval between the surface, facing the substrate 10, of the sub-catalyst layer 42 and the substrate 10 is designed to guarantee that the gap is arranged between a surface, facing the substrate 10, of the insulation layer 40 subsequently formed on the sub-catalyst layer and the substrate 10.

During specific implementation, the sub-catalyst layer 42 may be deposited by controlling an included angle between an implantation direction of the directional deposition technology and the direction perpendicular to the substrate 10.

Exemplarily, the included angle α between the implantation direction of the directional deposition technology and the direction perpendicular to the substrate 10 is an acute angle, for example, the included angle between the implantation direction of the directional deposition technology and the direction perpendicular to the substrate 10 is 5°-45°.

In this embodiment, by specially designing the included angle between the implantation direction of the directional deposition technology and the direction perpendicular to the substrate 10, it may guarantee that the gap is arranged between the sub-catalyst layer 42 formed on the sides of the recess 22 and the substrate 10, so as to guarantee that the gap 50 is arranged between the insulation layer 40 subsequently formed and the substrate 10 as well, thereby reducing parasitic capacitances formed between adjacent wires and improving performance of the semiconductor structure.

Step b, the sub-filling layer is formed on the sub-catalyst layer, wherein the sub-filling layer reacts to form a sub-insulation layer.

Figure 10:
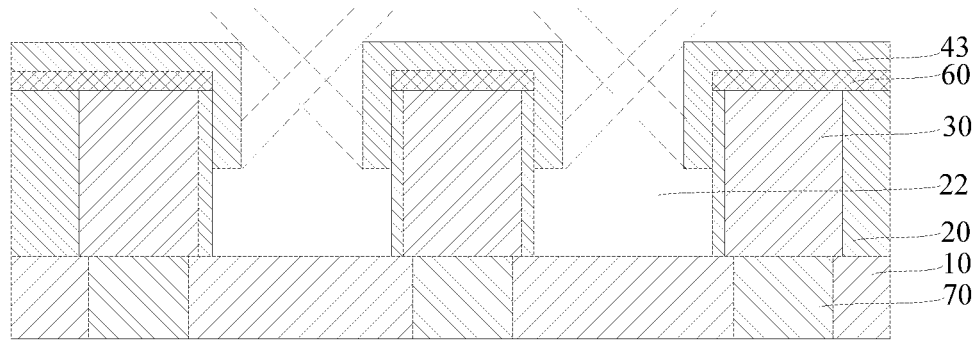
FIG. 10 is a schematic diagram for forming a sub-insulation layer in the method of manufacturing an interconnection structure provided in an embodiment of the present disclosure.

Specifically, as shown in FIG. 10, the sub-filling layer with a certain thickness is deposited on the sub-catalyst layer 42 through the directional deposition technology. For example, the sub-filling layer may be formed on the sub-catalyst layer 42 by utilizing the physical vapor deposition process or the plasma implantation process, wherein the sub-filling layer may be made from silicon oxide precursors, for example, the silicon oxide precursors may be silicon-containing compounds such as SiH4, tetramethylsilane (TMS) or 3-tert-butylsilanol group.

It is difficult to deposit the precursors on the substrate or dielectric layer directly since the precursors have large molecular weights. Therefore, in this embodiment, the sub-filling layer may only be deposited on the sub-catalyst layer 42 by utilizing relatively strong chemical bonding capacity of the sub-catalyst layer, and so a gap is arranged between the formed sub-insulation layer 43 and the substrate.

After the sub-filling layer is deposited on the sub-catalyst layer, a temperature of a reaction chamber for depositing the sub-filling layer is raised, so as to enable an inside of the reaction chamber to meet conditions of a thermal oxidation process, and further enable the sub-filling layer to react at a high temperature to form the sub-insulation layer 43, where the sub-insulation layer 43 is made from silicon oxide.

In this embodiment, a reaction temperature of the sub-filling layer is 200° C.-400° C. By controlling the reaction temperature, it is guaranteed that the sub-filling layer fully reacts with the sub-catalyst layer, so as to facilitate formation of the sub-insulation layer.

Step c, a sub-catalyst layer and a sub-filling layer are sequentially formed on the sub-insulation layer, where the sub-filling layer reacts to form another sub-insulation layer.

Specifically: impurity elements are implanted into the sub-insulation layer 43 through the directional deposition technology, where the impurity elements form the sub-catalyst layer 42 on a surface of the sub-insulation layer 43, and the sub-catalyst layer 42 is configured to enhance binding force between the sub-insulation layer 43 and the sub-filling layer. The sub-catalyst layer in this embodiment has the same material and functions as those of the sub-catalyst layer in step a, which are no more repeated in this embodiment.

Step b and step c are repeated at least once until the insulation layer 40 is formed, as shown in FIG. 2.

That is, the insulation layer 40 may include a plurality of sub-insulation layers 43 stacked in sequence, and a portion, located in the recess 22, of the insulation layer 40 constitutes the extension portion 41. In this embodiment, in order to explain a forming process of the insulation layer 40 in detail, the insulation layer 40 is divided into a first sub-insulation layer, a second sub-insulation layer . . . and an nth sub-insulation layer in sequence in a direction towards the recess 22. Each sub-insulation layer is formed as follows:

a first sub-catalyst layer is formed on the sides of the recess 22 and the top surface of the dielectric layer 20 by utilizing the directional deposition technology, the first sub-catalyst layer has electron-withdrawing compounds, and a gap 50 is arranged between the first sub-catalyst layer and the substrate 10.

Then, silicon oxide precursors are implanted onto the first sub-catalyst layer by utilizing the directional deposition technology, and the silicon oxide precursors react at a certain temperature to form the first sub-insulation layer.

After the first sub-insulation layer is formed, a second sub-catalyst layer is formed on the first sub-insulation layer by utilizing the directional deposition technology.

After the second sub-catalyst layer is formed, silicon oxide precursors are implanted onto the second sub-catalyst layer by utilizing the directional deposition technology, and the silicon oxide precursors react at a certain temperature to form the second sub-insulation layer.

By analogy, a third sub-catalyst layer and a third sub-insulation layer are formed on the second sub-insulation layer . . . and an nth sub-catalyst layer and an nth sub-insulation layer are formed on a (n−1)th sub-insulation layer. The first sub-insulation layer, the second sub-insulation layer . . . and the nth sub-insulation layer constitute the insulation layer 40, n being a positive integer.

It should be noted that in this embodiment, the insulation layer 40 may be formed by repeating step b and step c several times, or the insulation layer 40 filling a portion of the recess 22 may be directly formed only by using step a and step b, which is not specifically defined in this embodiment.

In the method of manufacturing an semiconductor structure provided by this embodiment, the gap is arranged between the portion, between adjacent wires, of the insulation layer and the substrate, that is, an air gap is arranged between adjacent wires, such that parasitic capacitance between adjacent wires may be reduced since a dielectric constant of air is smaller than that of the insulation layer, thereby reducing signal delay of the interconnection structure and further improving performance of the semiconductor structure.

Each embodiment or implementation in the specification is described in a progressive manner, each embodiment focuses on differences with another embodiment, and the embodiments may refer to one another for the same and similar portions.

In description of the specification, the description with reference to terms such as "an embodiment", "some embodiments", "exemplary embodiments", "examples", "particular examples", or "some examples" means that specific features, structures, materials, or characteristics described in combination with the embodiment(s) or example(s) are included in at least one embodiment or example of the present disclosure.

In the specification, schematic expressions of the above terms do not necessarily refer to the same embodiment or example. Furthermore, the specific features, structures, materials or characteristics described may be combined in any one or more embodiments or examples in a suitable manner.

Finally, it should be noted that the above embodiments are merely used to describe the technical solution of the present disclosure, rather than limiting the same. Although the present disclosure has been described in detail with reference to the foregoing embodiments, those skilled in the art should understand that the technical solution described in the foregoing embodiments may still be modified, or some or all of the technical features therein may be equivalently replaced. However, these modifications or substitutions do not make the essence of the corresponding technical solution deviate from the scope of the technical solutions of each embodiment of the present disclosure.

The invention claimed is:

1. A method of manufacturing an interconnection structure, comprising:
   providing a substrate;
   forming a dielectric layer on the substrate, wherein a plurality of wires are arranged in the dielectric layer at intervals;
   patterning the dielectric layer, wherein a plurality of recesses are formed in the dielectric layer, the recess is located between adjacent wires, and a bottom of the recess exposes a surface of the substrate; and
   forming an insulation layer on the dielectric layer, wherein the insulation layer includes an extension portion extending into the recess, and a gap is arranged between the extension portion and the substrate;
   wherein the forming an insulation layer on the dielectric layer comprises:
   step a, forming a sub-catalyst layer on sides of the recess and a top surface of the dielectric layer, wherein the gap is arranged between the sub-catalyst layer on the sides of the recess and the substrate;
   step b, forming a sub-filling layer on the sub-catalyst layer, wherein the sub-filling layer reacts to form a sub-insulation layer;
   step c, sequentially forming a sub-catalyst layer and a sub-filling layer on the sub-insulation layer, wherein the sub-filling layer reacts to form another sub-insulation layer; and
   repeating step b and step c at least once until the insulation layer is formed.

2. The method of manufacturing an interconnection structure according to claim 1, wherein a plurality of the sub-insulation layers are sequentially stacked to constitute the insulation layer, and a portion, located in the recess, of the insulation layer constitutes the extension portion.

3. The method of manufacturing an interconnection structure according to claim 2, wherein after the forming a dielectric layer on the substrate and before the patterning the dielectric layer, the method further comprises:
   forming a barrier layer on an initial dielectric layer, wherein the barrier layer is configured to prevent conductive material in the wires from diffusing to the insulation layer.

4. The method of manufacturing an interconnection structure according to claim 1, wherein the step a comprises:
   implanting impurity elements into the sides of the recess and the top surface of the dielectric layer through a directional deposition technology, wherein the impurity elements form the sub-catalyst layer on a surface of the dielectric layer, and the sub-catalyst layer contains electron-withdrawing compounds, for enhancing binding force between the dielectric layer and the sub-filling layer;
   the step b comprises:
   depositing silicon oxide precursors onto the sub-catalyst layer through the directional deposition technology, wherein the silicon oxide precursors react at a certain temperature to form the sub-insulation layer, and the silicon oxide precursors constitute the sub-filling layer; and
   the step c comprises:
   implanting impurity elements into the sub-insulation layer through the directional deposition technology, wherein the impurity elements form the sub-catalyst layer on a surface of the sub-insulation layer, and the sub-catalyst layer is configured to enhance binding force between the sub-insulation layer and the sub-filling layer.

5. The method of manufacturing an interconnection structure according to claim 4, wherein an included angle between an implantation direction of the directional deposition technology and a direction perpendicular to the substrate is an acute angle.

6. The method of manufacturing an interconnection structure according to claim 5, wherein the included angle between the implantation direction of the directional deposition technology and the direction perpendicular to the substrate is 5°-45°.

7. The method of manufacturing an interconnection structure according to claim 6, wherein the impurity elements comprise at least one of boron group element, boron trifluoride, aluminium trichloride and sulfur trioxide.

8. The method of manufacturing an interconnection structure according to claim 1, wherein a reaction temperature of the sub-filling layer is 200° C.-400° C.

9. The method of manufacturing an interconnection structure according to claim 1, wherein the forming a dielectric layer on the substrate, wherein a plurality of wires are arranged in the dielectric layer at intervals comprises:
   forming an initial dielectric layer on the substrate;
   patterning the initial dielectric layer and etching a portion of the initial dielectric layer to form a plurality of openings arranged at intervals in the initial dielectric layer, wherein a remainder of the initial dielectric layer constitutes the dielectric layer; and
   forming the wires in the openings, wherein a top surface, away from the substrate, of the wire is flush with a top surface of the initial dielectric layer.

* * * * *